United States Patent
Takahashi et al.

(10) Patent No.: US 9,336,937 B2
(45) Date of Patent: May 10, 2016

(54) $CO_2FE$-BASED HEUSLER ALLOY AND SPINTRONICS DEVICES USING THE SAME

(71) Applicant: NATIONAL INSTITUTE FOR MATERIALS SCIENCE, Tsukuba-shi, Ibaraki (JP)

(72) Inventors: Yukiko Takahashi, Tsukuba (JP); Srinivasan Ananthakrishnan, Tsukuba (JP); Varaprasad Bollapragada, Tsukuba (JP); Rajanikanth Ammanabrolu, Tsukuba (JP); Jaivardhan Sinha, Tsukuba (JP); Masamitsu Hayashi, Tsukuba (JP); Takao Furubayashi, Tsukuba (JP); Shinya Kasai, Tsukuba (JP); Shigeyuki Hirayama, Tsukuba (JP); Seiji Mitani, Tsukuba (JP); Kazuhiro Hono, Tsukuba (JP)

(73) Assignee: NATIONAL INSTITUTE FOR MATERIALS SCIENCE, Tsukuba-shi (JP)

(*) Notice: Subject to any disclaimer, the term of this patent is extended or adjusted under 35 U.S.C. 154(b) by 153 days.

(21) Appl. No.: 13/935,095

(22) Filed: Jul. 3, 2013

(65) Prior Publication Data
US 2013/0302649 A1     Nov. 14, 2013

Related U.S. Application Data

(63) Continuation of application No. PCT/JP2011/079622, filed on Dec. 21, 2011.

(30) Foreign Application Priority Data

Jan. 7, 2011  (JP) ................. 2011-002410
Oct. 14, 2011  (JP) ................. 2011-227488

(51) Int. Cl.
    *H01F 10/32*    (2006.01)
    *H01F 10/16*    (2006.01)
    (Continued)

(52) U.S. Cl.
    CPC ........... *H01F 10/16* (2013.01); *C22C 19/07* (2013.01); *G01R 33/093* (2013.01);
    (Continued)

(58) Field of Classification Search
    None
    See application file for complete search history.

(56) References Cited

U.S. PATENT DOCUMENTS 7,691,215 B2 * 4/2010 Felser ................ 148/425
2004/0114283 A1  6/2004 Felser
(Continued)

FOREIGN PATENT DOCUMENTS

| JP | 2004-524689 A | 8/2004 |
| JP | 2010-037580 A | 2/2010 |
| JP | 2010-126733 A | 6/2010 |

OTHER PUBLICATIONS

E. Vilanova Vidal et al. (Phys. Rev. B, v83, 174410, 2011).*
(Continued)

*Primary Examiner* — Kevin Bernatz
(74) *Attorney, Agent, or Firm* — Westerman, Hattori, Daniels & Adrian, LLP

(57) ABSTRACT

To realize a spintronics device with high performance, it is an object of the present invention to provide a $Co_2Fe$-based Heusler alloy having a spin polarization larger than 0.65, and a high performance spintronics devices using the same. A $Co_2Fe(Ga_xGe_{1-x})$ Heusler alloy shows a spin polarization higher than 0.65 by a PCAR method in a region of $0.25<x<0.60$ and it has a Curie temperature as high as 1288K. A CPP-GMR device that uses the $Co_2Fe(Ga_xGe_{1-x})$ Heusler alloy as an electrode exhibits the world's highest MR ratio, an STO device exhibits high output, and an NLSV device exhibits a high spin signal.

5 Claims, 20 Drawing Sheets

(51) Int. Cl.

| | | |
|---|---|---|
| C22C 19/07 | (2006.01) | |
| G01R 33/09 | (2006.01) | |
| G01R 33/12 | (2006.01) | |
| G11C 11/16 | (2006.01) | |
| H01L 43/10 | (2006.01) | |
| H01F 10/193 | (2006.01) | |
| G11B 5/31 | (2006.01) | |
| G11B 5/39 | (2006.01) | |
| H01L 43/08 | (2006.01) | |
| B82Y 10/00 | (2011.01) | |
| B82Y 25/00 | (2011.01) | |

(52) U.S. Cl.
CPC ......... *G01R 33/098* (2013.01); *G01R 33/1284* (2013.01); *G11B 5/313* (2013.01); *G11B 5/3906* (2013.01); *G11C 11/16* (2013.01); *G11C 11/161* (2013.01); *H01F 10/1936* (2013.01); *H01F 10/329* (2013.01); *H01L 43/08* (2013.01); *H01L 43/10* (2013.01); *B82Y 10/00* (2013.01); *B82Y 25/00* (2013.01); *H01F 10/325* (2013.01); *Y10T 428/1121* (2015.01); *Y10T 428/1129* (2015.01); *Y10T 428/12611* (2015.01)

(56) References Cited

U.S. PATENT DOCUMENTS

| | | | |
|---|---|---|---|
| 2007/0165337 A1* | 7/2007 | Ide et al. | 360/324.2 |
| 2007/0171579 A1* | 7/2007 | Ide et al. | 360/324.2 |
| 2009/0168269 A1* | 7/2009 | Carey et al. | 360/324.11 |
| 2009/0284873 A1* | 11/2009 | Gill | 360/314 |
| 2011/0084429 A1 | 4/2011 | Felser | |
| 2014/0146420 A1* | 5/2014 | Shimizu et al. | 360/234.7 |
| 2015/0010780 A1* | 1/2015 | Carey et al. | 428/811.3 |

OTHER PUBLICATIONS

Wu et al. (Cailiao Daobao, v25, 142-146, 2011), Abstract Only.*
International Search Report for PCT/JP2011/079622, mailing date of Mar. 13, 2012.
S. Varaprasad et al., "Enhanced Spin Polarization of Co2MnGe Heusler Alloy by Substitution of Ga for Ge", Applied Physics Express 3, pp. 023002-1-023002-3, (2010), Cited in Specification.
N. Hase et al., "Current-perpendicular-to-plane spin valves with a Co2Mn(Ga0.5Sn0.5) Heusler alloy", Journal of Applied Physics 108, p. 093916-1-093916-5, (2010), Cited in Specification.
T. M. Nakatani et al., "Structure, magnetic property, and spin polarization of Co2FeAlxSi1-x Heusler alloys", Journal of Applied Physics 102, pp. 033916-1-033916-8, (2007), Cited in Specification.
T. M. Nakatani et al., "Bulk and interfacial scatterings in current-perpendicular-to-place giant magnetoresistance with Co2Fe(Al0.5Si0.5) Heusler alloy layers and Ag spacer", Applied Physics Letters 96, pp. 212501-1-212501-3, (2010), Cited in Specification.
M. Zhang et al., "The magnetic and transport properties of the Co2FeGa Heusler alloy", Journal of Physics D: Applied Physics 37, pp. 2049-2053, (2004), Cited in Specification.
R. Y. Umetsu et al., "Powder neutron diffraction studies for the L21 phase of Co2YGa (Y=Ti, V, Cr, Mn and Fe) Heusler alloys", Journal of Alloys and Compounds 499, pp. 1-6, (2010), Cited in Specification.
K. R. Kumar et al., "First-Principles Calculation and Experimental Investigations on Full-Heusler Alloy Co2Fe Ge", IEEE Transaction on Magnetics, vol. 45, No. 10, pp. 3997-3999, (2009), Cited in Specification.
Ministry of Education, Culture, Sports, Science and Technology; "Research and Development for the construction of Next Generation IT Fundamental Technology", Research and development of device/system fundamental technology for high performance/ultra-low power consumption computing, New energy and industrial technology development organization, "Development of Nanobit Technology for Ultra-high density magnetic recording (Green IT project)", Joint outcome report meeting, pp. 1-43, (2010), With Partial English translation.
Y. Fukuma et al., "Giant enhancement of spin accumulation and long-distance spin precession in metallic lateral spin valves", Nature Materials, vol. 10, pp. 527-531, (2011), Cited in Specification.
B. Balke et al., "Structural characterization of the Co2FeZ (Z=Al, Si, Ga, and Ge) Heusler compounds by x-ray diffraction and extended x-ray absorption fine structure spectroscopy", Applied Physics Letters 90, pp. 172501-1-172501-3, (2007), Cited in Specification.

* cited by examiner

$Co_2Fe$-BASED HEUSLER ALLOY AND SPINTRONICS DEVICES USING THE SAME

TECHNICAL FIELD

The present invention relates to a $Co_2Fe$-based Heusler alloy with high spin polarization and a spintronics device using the same.

BACKGROUND ART

Materials with a high spin polarization are required to achieve high performance spintronics devices, such as magnetic random access memory (MRAM), spin metal-oxide-semiconductor field effect transistor (spin MOSFET), tunnel magnetoresistance (TMR) used for a read head of a hard disk drive, giant magnetoresistance (GMR), spin torque oscillator (STO), and nonlocal spin valve (NLSV) which has been gained attention as a next generation read head. Co-based Heusler alloys are the candidates for highly spin polarized material, because some of the Co-based Heusler alloys are predicted to be a half-metal (half-metal: no density of states in one band at Fermi level, 100% spin polarization) and have a Curie temperature sufficiently higher than a room temperature.

Heusler alloys have an $L2_1$ ordered structure and their chemical formula is $X_2YZ$. However, since the kinetics of $L2_1$ ordering is weak, a perfect $L2_1$ structure may not be obtained but disorder structures are easily formed. The structure with the disordering between Y and Z is a B2 structure. That between X, Y and Z is an A2 structure. The reduction of the spin polarization by the disordering is theoretically showed. Experimentally, $Co_2MnSi$ which is predicted to be a half-metal has the spin polarization of 0.59 (59%) estimated by a point contact Andreev reflection (PCAR) method. The low spin polarization is due to the disorder structure.

The search for high spin polarized materials have been carried out up to now. According to Non Patent Literature 1, the high spin polarization of 75% was obtained by the substitution of Ga for Ge in $Co_2MnGe$. Since the $Co_2MnGaGe$ is an intermetallic compound, high degree of $L2_1$ order can be achieved. However, Mn in $Co_2MnGaGe$ readily causes an oxidation and diffuses into an Ag layer used for a non-magnetic metal of current-perpendicular-to-plane (CPP)-GMR devices. On the other hand, $Co_2Fe$-based Heusler alloys do not have such problems. Therefore, the development of $Co_2Fe$-based Heusler alloys with high spin polarization (more than 0.65 by PCAR measurement) is expected.

Among the $Co_2Fe$-based Heusler alloys, $Co_2FeAl_{0.5}Si_{0.5}$, which is formed by the substation of Al with Si in $Co_2FeSi$, is well known as a highly spin polarized material. In Non Patent Literature 3, it has the spin polarization of 0.6 (60%). CPP-GMR using this alloy has large magnetoresistance change of 34% at RT and resistance-area product of 8 $m\Omega\mu m^2$. The spin polarization of $Co_2FeAl_{0.5}Si_{0.5}$ was estimated to be 0.7 (70%) and 0.77 (77%) at RT and 14 K, respectively. In order to improve the properties of spintronics devices, the development of the highly spin polarized materials higher than $Co_2FeAlSi$ is strongly required.

CITATION LIST

Non Patent Literature

Non Patent Literature 1. B. Varaprasad et al., Appl. Phys. Express. 3, 023002 (2010).

Non Patent Literature 2: N. Hase et al., JAP108, 093916 (2010)

Non Patent Literature 3: T. M. Nakatani et al., JAP, 102, 033916 (2007).

Non Patent Literature 4: T. M. Nakatani et al. Appl. Phys. Lett., 96, 212501 (2010).

Non Patent Literature 5: B. Balke et al., APL90, 172501, (2007).

Non Patent Literature 6: M. Zhang et al., JPD37, 2049 (2004).

Non Patent Literature 7: R. Y. Umetsu et al., JAC499, (2010).

Non Patent Literature 8: K. R. Kumar et al., IEEE Trans. Magn., 45, 3997 (2009).

Non Patent Literature 9: Ministry of Education, Culture, Sports, Science and Technology; Research and Development for the Construction of Next Generation IT Fundamental Technology, "Research and development of device/system fundamental technology for high performance/ultra-low power consumption computing"; and New energy and industrial technology development organization, "Development of Nanobit Technology for Ultra-high density magnetic recording (Green IT project)", Joint outcome report meeting, Oct. 29, 2010.

Non Patent Literature 10: Y. Fukuma et al., Nature Mater. 10, 527 (2011).

SUMMARY OF INVENTION

Technical Problem

It is an object of the present invention to provide a $Co_2Fe$-based Heusler alloy with high spin polarization and a high performance spintronics device using the same.

Solution to Problem

In the present invention, the spin polarization is caused to increase by the increment of the density of state of one of majority and minority spin states by substituting Ga for some of Ge in $Co_2FeGe$.

Heusler alloys, $Co_2FeGa$ and $Co_2FeGe$ are already reported in Non Patent Literatures 5-8. According to these references, the followings are known;
$Co_2FeGa$ bulk alloy:
Formation of an $L2_1$ single phase
Curie temperature is 1093 K.
Spin polarization is 0.59 (59%).
Not half-metal according to the calculation.
$Co_2FeGe$ bulk alloy
The formation of an $L2_1$ single phase is difficult.
Half-metallicity was predicted by the calculation.
There is no report on the $Co_2Fe(GaGe)$ neither bulk nor thin film.

The present inventors have conducted experiments in the following procedures:
(1) preparation and characterization of a $Co_2Fe(GaGe)$ bulk alloys
(2) preparation and characterization of a $Co_2Fe(GaGe)$ thin film, and
(3) fabrication of a high performance spintronics devices, and found a $Co_2Fe(GaGe)$ thin film alloy that has high spin polarization and exhibits a high GMR and oscillation characteristics, and eventually developed a high performance spintronics devices incorporating the thin film.

Invention 1 provides a Co$_2$Fe-based Heusler alloy for use in a spintronics device, in which the Co$_2$Fe-based Heusler alloy has a component composition of Co$_2$Fe(Ga$_x$Ge$_{1-x}$) (0.25<x<0.60)

Invention 2 provides the Co$_2$Fe-based Heusler alloy of Invention 1, in which the Co$_2$Fe-based Heusler alloy has a spin polarization larger than 0.65.

Invention 3 provides a CPP-GMR device using the Co$_2$Fe-based Heusler alloy thin film of Invention 1 as a ferromagnetic electrode, in which the CPP-GMR device has a thin-film layered structure of MgO substrate/Cr/Ag/Co$_2$Fe-based Heusler alloy/Ag/Co$_2$Fe-based Heusler alloy/Ag/Ru.

Invention 4 provides an STO device using the Co$_2$Fe-based Heusler alloy thin film of Invention 1 as a ferromagnetic electrode, in which the STO device has a thin-film layered structure of MgO substrate/Cr/Ag/Co$_2$Fe-based Heusler alloy/Ag/Co$_2$Fe-based Heusler alloy/Ag/Ru.

Invention 5 provides a NLSV device using the Co$_2$Fe-based Heusler alloy thin film of Invention 1 as a ferromagnetic electrode, in which the NLSV device has two wires of MgO substrate/Cr/Ag/Co$_2$Fe-based Heusler alloy which is bridged by and an Ag non-magnetic wire that bridges the two wires.

Advantageous Effects of Invention

It becomes possible to produce a Heusler alloy thin film having a spin polarization larger than 0.65 by substituting Ga for some of Ge of Heusler alloy Co$_2$FeGe, and produce a CPP-GMR device showing a high MR ratio, an STO device showing high output, and an NLSV device, which incorporate the above described thin film.

DESCRIPTION OF EMBODIMENTS

While the present invention has features as described above, embodiments thereof will be described below.

Figure 1:
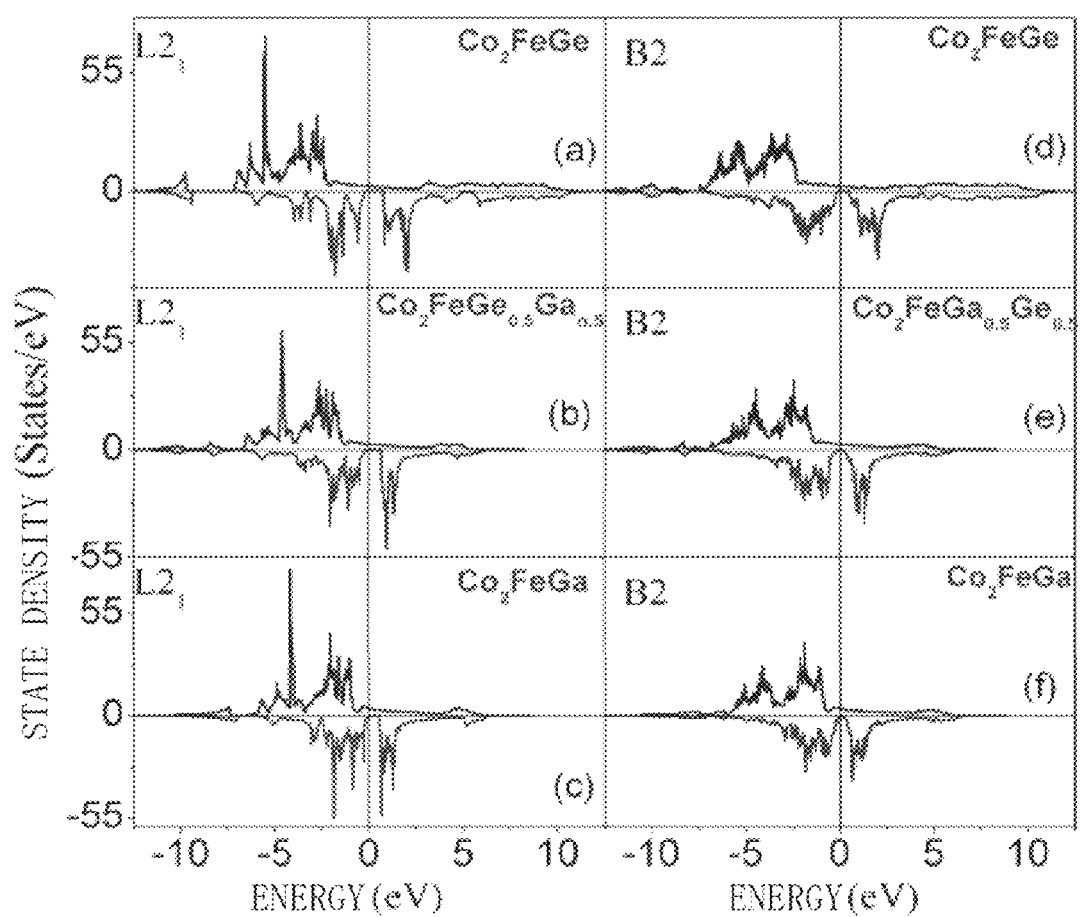
FIG. 1 shows density of states of Co$_2$FeGa, Co$_2$FeGe, and Co$_2$Fe(Ga$_{0.5}$Ge$_{0.5}$) calculated by a first-principle method.
Figure 2:
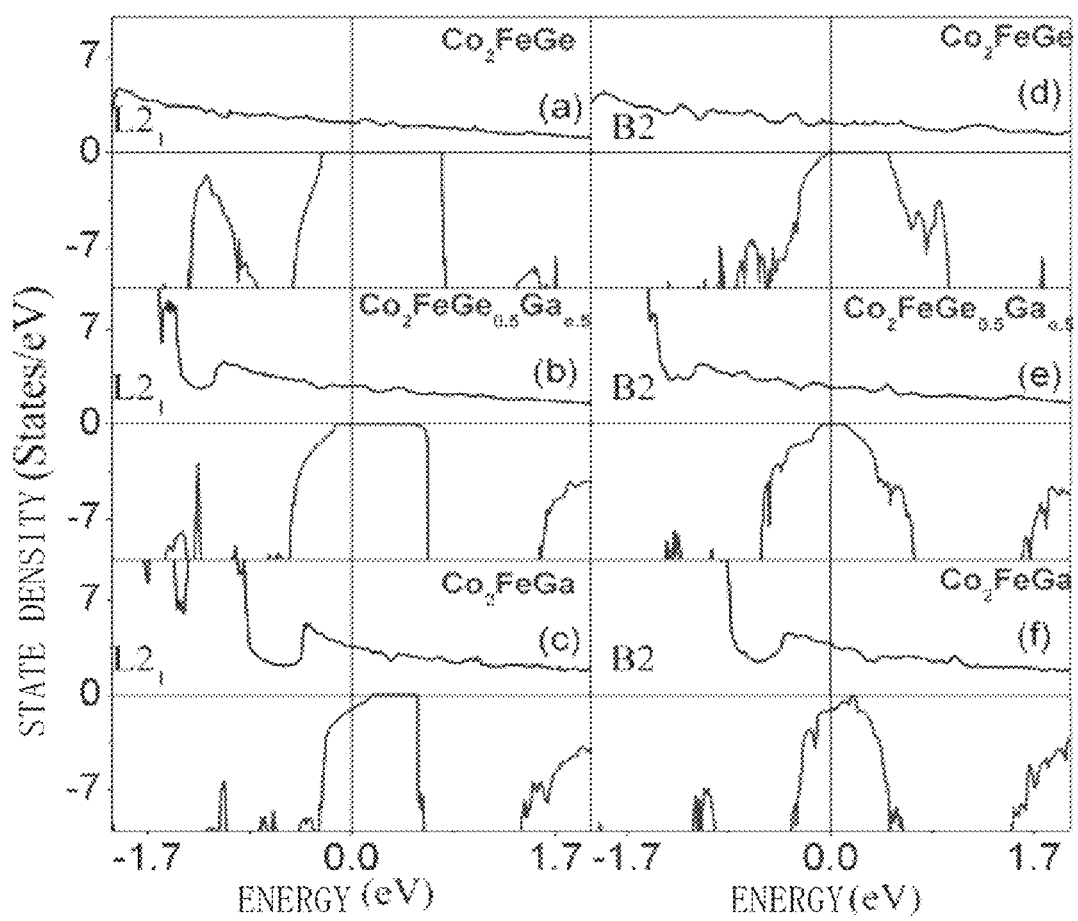
FIG. 2 shows density of state (enlarged graph around Fermi level) of Co$_2$FeGa, Co$_2$FeGe, and Co$_2$Fe(Ga$_{0.5}$Ge$_{0.5}$) calculated by a first-principle method.

<First-principal calculation> FIGS. 1 and 2 show the density of states of Co$_2$FeGa, Co$_2$FeGe and Co$_2$Fe(Ga$_{0.5}$Ge$_{0.5}$) by a first principle calculation. The calculation is conducted by the Generalized Gradient Approximation (GGA) method taking into account Coulomb potential, where the Coulomb potential is set to a value to reproduce magnetization. There are two kinds of crystal structures: L2$_1$ and B2. In the L2$_1$ structure, Co$_2$FeGe in which the Fermi level is in the band gap of the minority spin states is a half-metal, and Co$_2$FeGa in which the minority spin states exist in the Fermi level is not a half-metal. Meanwhile, Co$_2$Fe(Ga$_{0.5}$Ge$_{0.5}$) is a half-metal. In the case of the B2 structure, although the band gap in the minority spin state reduces, Co$_2$Fe(Ga$_{0.5}$Ge$_{0.5}$) is a half-metal because the Fermi level is in the middle of the band gap. Since the Co$_2$Fe (Ga$_{0.5}$Ge$_{0.5}$) is a half-metal even in the B2 structure and the effect of the disordering on the spin polarization of Co$_2$Fe (Ga$_{0.5}$Ge$_{0.5}$) is small due to the Fermi level in the middle of the band gap, it is expected to show the high spin polarization even in the thin film which is difficult to get high degree of L2$_1$ order.

EXAMPLES

<Bulk Alloy>

For Co$_2$Fe(Ga$_x$Ge$_{1-x}$), ingots having component compositions shown in Table 1 and purity higher than 99.99% were prepared, and the ingots were arc melted to fabricate button-like bulk alloys. The weight of a bulk alloy was 15 g. The bulk alloys were annealed at 450° C. for 168 hours in He atmosphere. From the chemical analysis by inductive coupling plasma (ICP), it was confirmed that the compositions of the bulk alloys were as designed.

TABLE 1

| Component formulation of Co$_2$FeGa$_x$Ge$_{1-x}$ alloy (unit g) | | | | |
|---|---|---|---|---|
| x | Co | Fe | Ga | Ge |
| x = 1 | 7.2615 | 3.4410 | 4.2961 | 0 |
| x = 0.75 | 7.2407 | 3.4311 | 3.2124 | 1.1156 |

TABLE 1-continued

Component formulation of $Co_2FeGa_xGe_{1-x}$ alloy (unit g)

| x | Co | Fe | Ga | Ge |
|---|---|---|---|---|
| x = 0.5 | 7.2191 | 3.4209 | 2.1352 | 2.2246 |
| x = 0.25 | 7.1977 | 3.4107 | 1.0644 | 3.3270 |
| x = 0 | 7.1749 | 3.3999 | 0 | 4.4251 |

The structure was evaluated by an X-ray diffraction method (XRD), magnetic properties by a superconducting quantum interference device (SQUID), and the spin polarization by a point contact Andreev reflection (PCAR) method.

Figure 3:
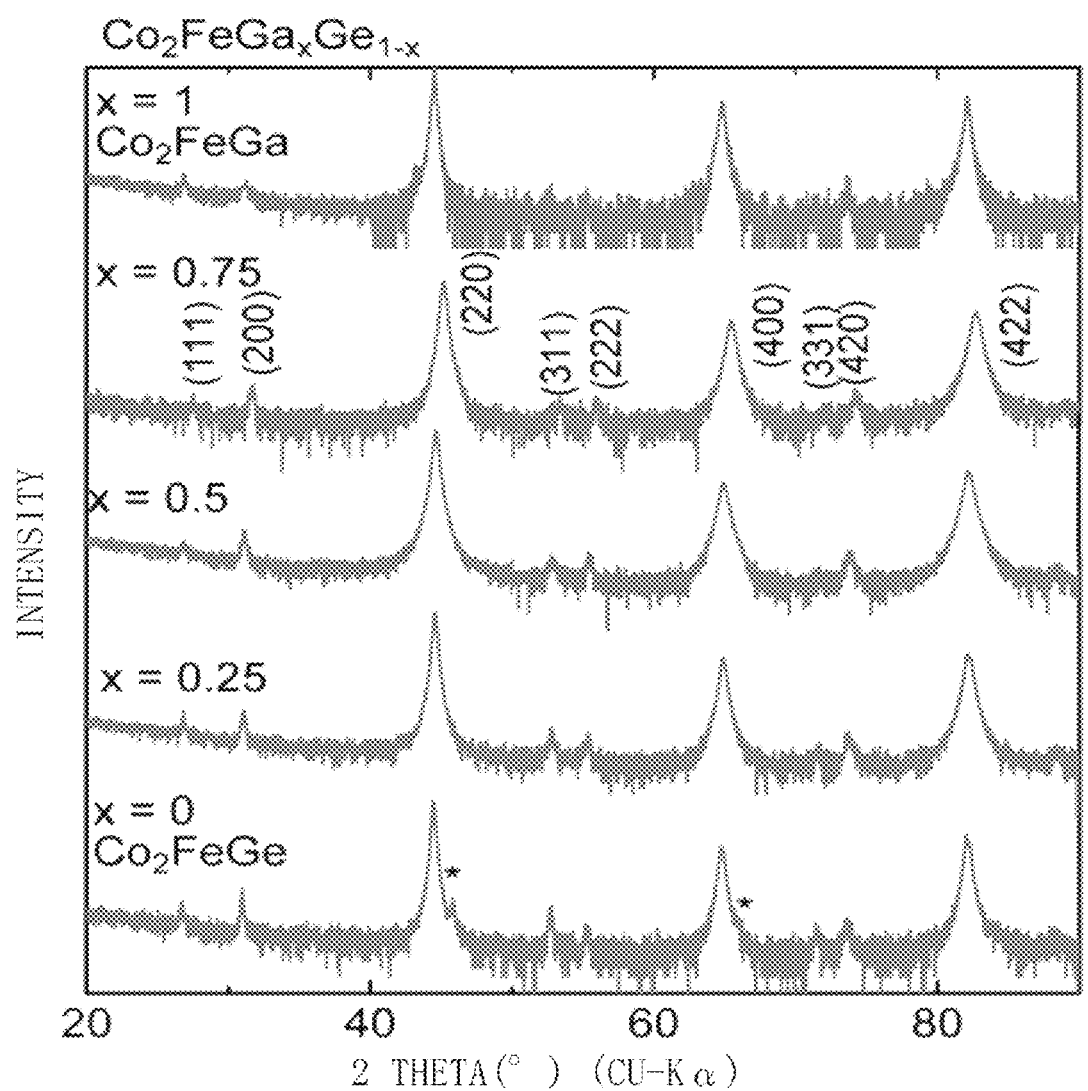
FIG. 3 shows XRD patterns of Co$_2$Fe (Ga$_x$Ge$_{1-x}$) bulk alloys.

FIG. 3 shows the XRD patterns of $Co_2Fe(Ga_xGe_{1-x})$ bulk alloys. In $Co_2FeGe$ at x=0, there were peaks of a second phase as shown by other than the peaks of an $L2_1$ structure. It means that it is not an $L2_1$ single phase. On the other hand, the alloys with x=0.25-1 show an $L2_1$ single phase.

Figure 4:
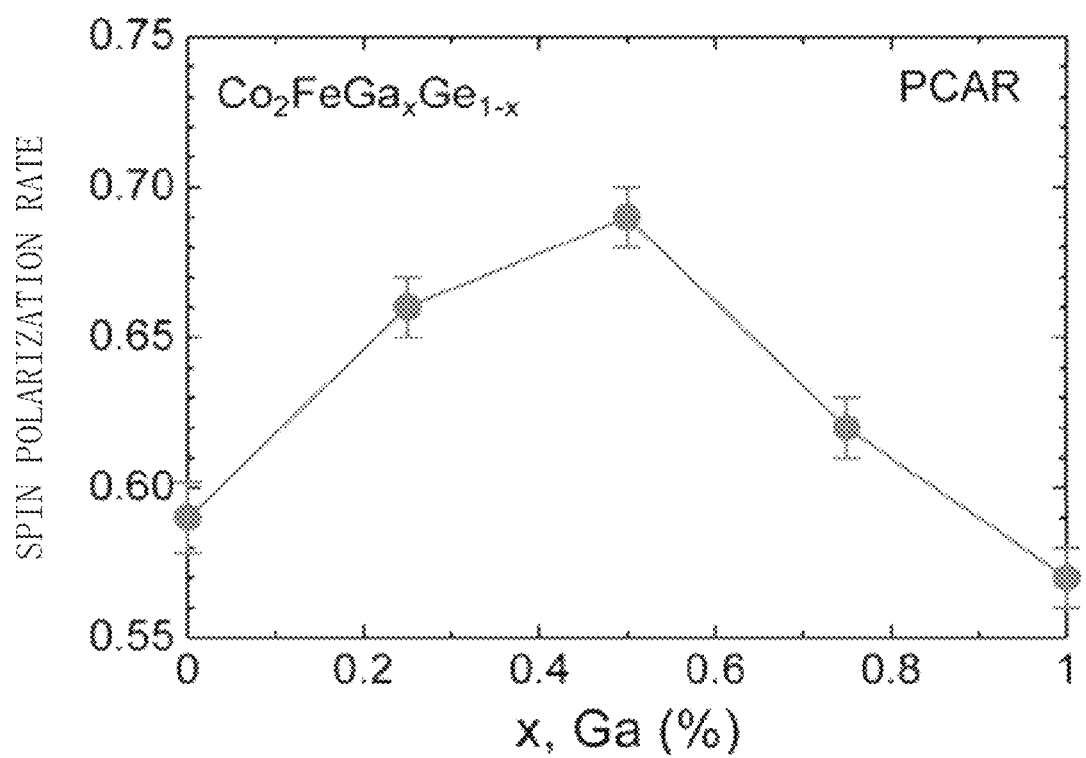
FIG. 4 shows the spin polarization dependence of x (Ga) for Co$_2$Fe (Ga$_x$Ge$_{1-x}$) bulk alloys.

FIG. 4 shows the spin polarization dependence of x. The spin polarization shows maximum of 0.68 at x=0.5. High spin polarization (larger than 0.65) was obtained in the range of 0.25<x<0.60. The spintronics devices with this range can show high performance.

Figure 5:
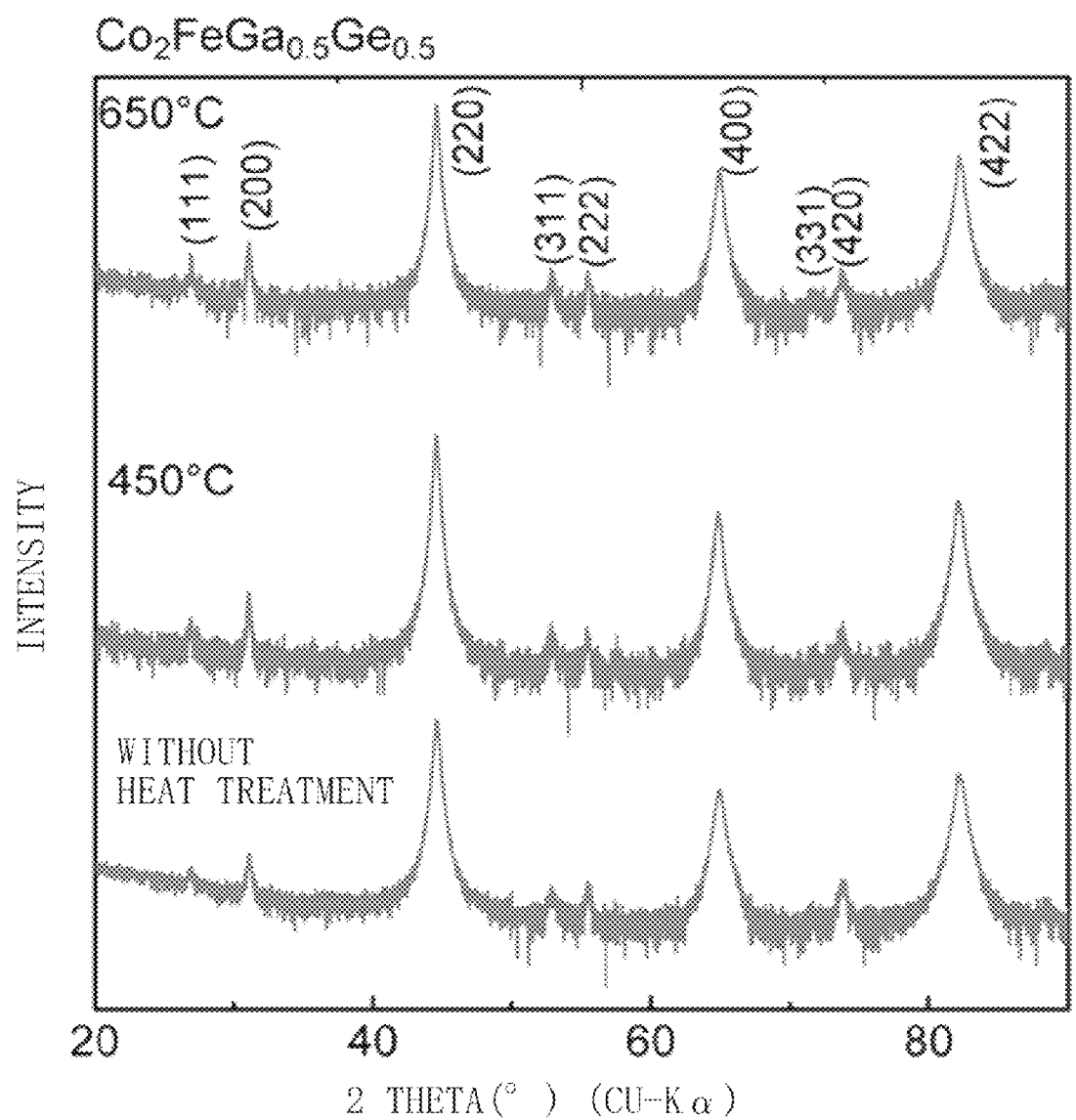
FIG. 5 shows XRD patterns of Co$_2$Fe(Ga$_{0.5}$Ge$_{0.5}$) alloys annealed at various temperatures.

FIG. 5 shows the XRD patterns of $Co_2Fe(Ga_xGe_{1-x})$ annealed at various temperatures. In Table 2, relative integrated intensities of (111) and (220) which are for the degree of $L2_1$ order and those of (200) and (220) which are for the degree of B2 order are shown. Both of the $L2_1$ order and the B2 order do not change with the annealing temperature. It means that this alloy can achieve high degree of $L2_1$ order at a relatively low annealing temperature of 450° C., which is one of the characters of this alloy.

TABLE 2

Heat-treatment temperature dependence of degree of L21 and B2 order (unit %)

| | Without heat treatment | 450° C. | 550° C. | 650° C. |
|---|---|---|---|---|
| $L2_1$ | 30 | 31 | 30 | 27 |
| B2 | 58 | 63 | 61 | 62 |

Figure 6:
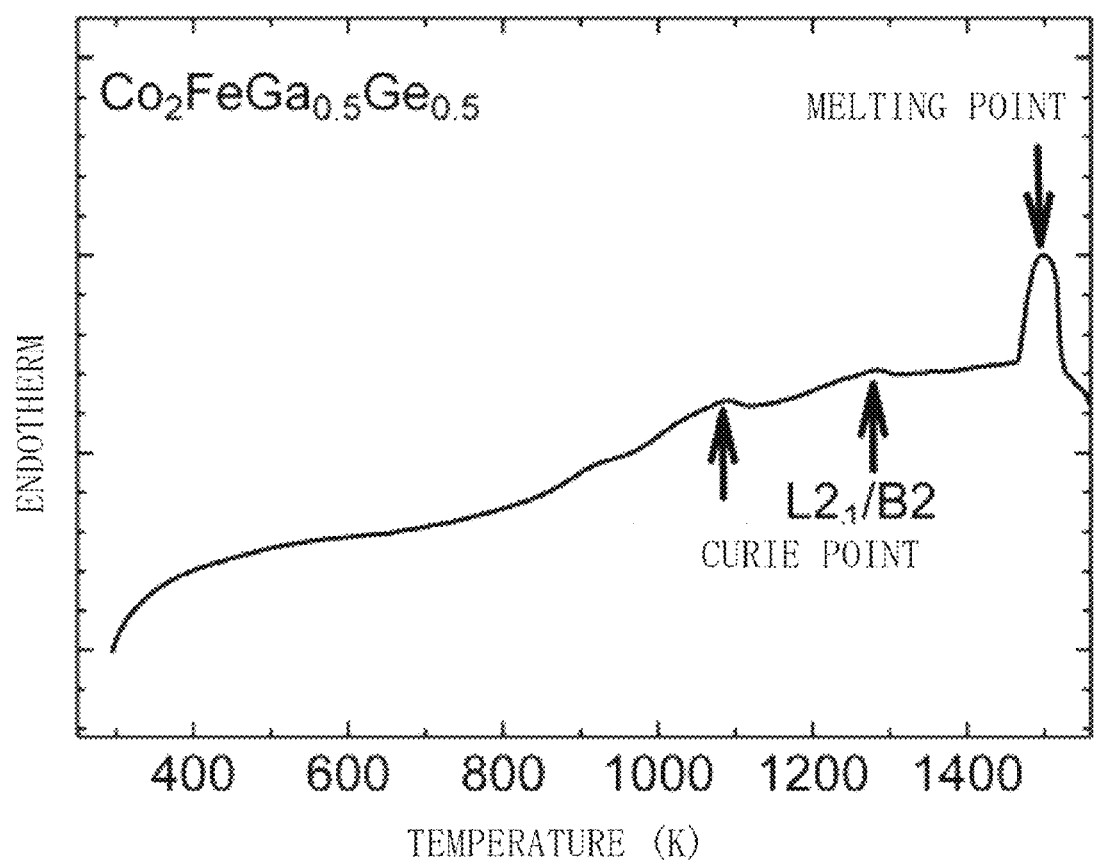
FIG. 6 is a DTA curve of Co$_2$Fe(Ga$_{0.5}$Ge$_{0.5}$).

FIG. 6 shows a differential thermal analysis (DTA) curve of $Co_2Fe(Ga_{0.5}Ge_{0.5})$. It is seen that the Curie point was as high as 1080K, which is an advantage in practical uses. The order-disorder transformation temperature of $L2_1$/B2 was 1288K.

<Alloy Thin Film>

Since the above described experiments on the bulk alloys have revealed that a $Co_2Fe(Ga_{0.5}Ge_{0.5})$ alloy has a high spin polarization, thin film experiment was carried out. Thin films were fabricated by a magnetron sputtering method with a $Co_{45.56}Fe_{22.65}Ga_{17.92}Ge_{15.63}$ target. The composition of the thin film by ICP analysis was $Co_{52}Fe_{22}Ga_{13}Ge_{13}$. The used substrate was of MgO single crystal. A 20 nm-thick $Co_{52}Fe_{22}Ga_{13}Ge_{13}$ thin film was fabricated on the underlayer of Cr(10)/Ag(100). Here, the numbers in parentheses denote the thickness of each metal film.

Figure 7:
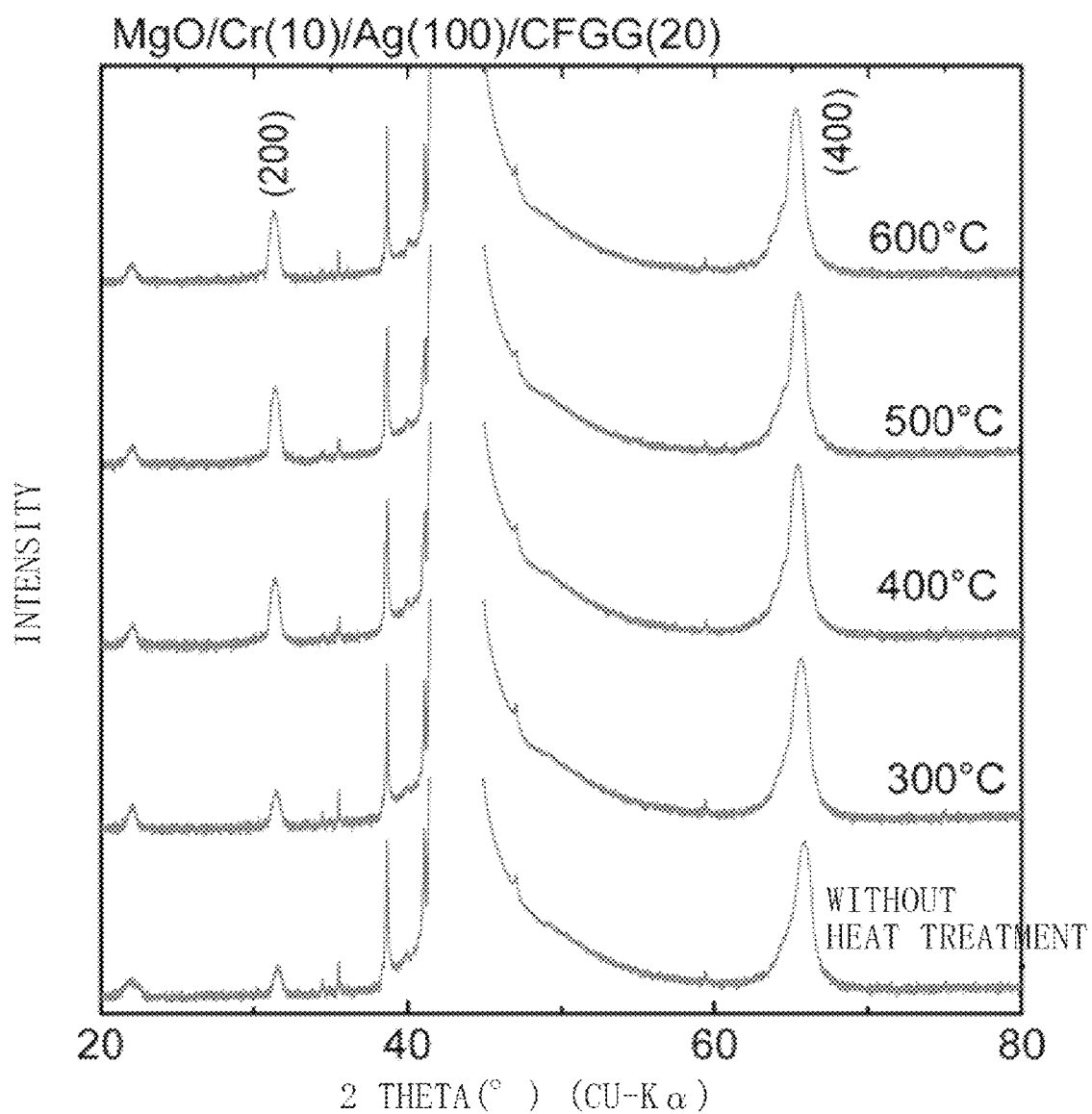
FIG. 7 shows XRD patterns of Co$_{52}$Fe$_{22}$(Ga$_{13}$Ge$_{13}$) thin films annealed at various temperatures.

FIG. 7 shows the XRD patterns of the thin films annealed at different temperatures. Since the diffraction peaks of (200) and (400) of the $Co_{52}Fe_{22}Ga_{13}Ge_{13}$ thin film and (100) of the MgO single crystal substrate have been observed, it is found that the $Co_{52}Fe_{22}Ga_{13}Ge_{13}$ thin film has been epitaxially grown on the MgO single crystal substrate. The diffraction peaks from (200) and (400) were observed at all the annealing temperatures. It means that these films have more than a B2 ordered structure.

Figure 8:
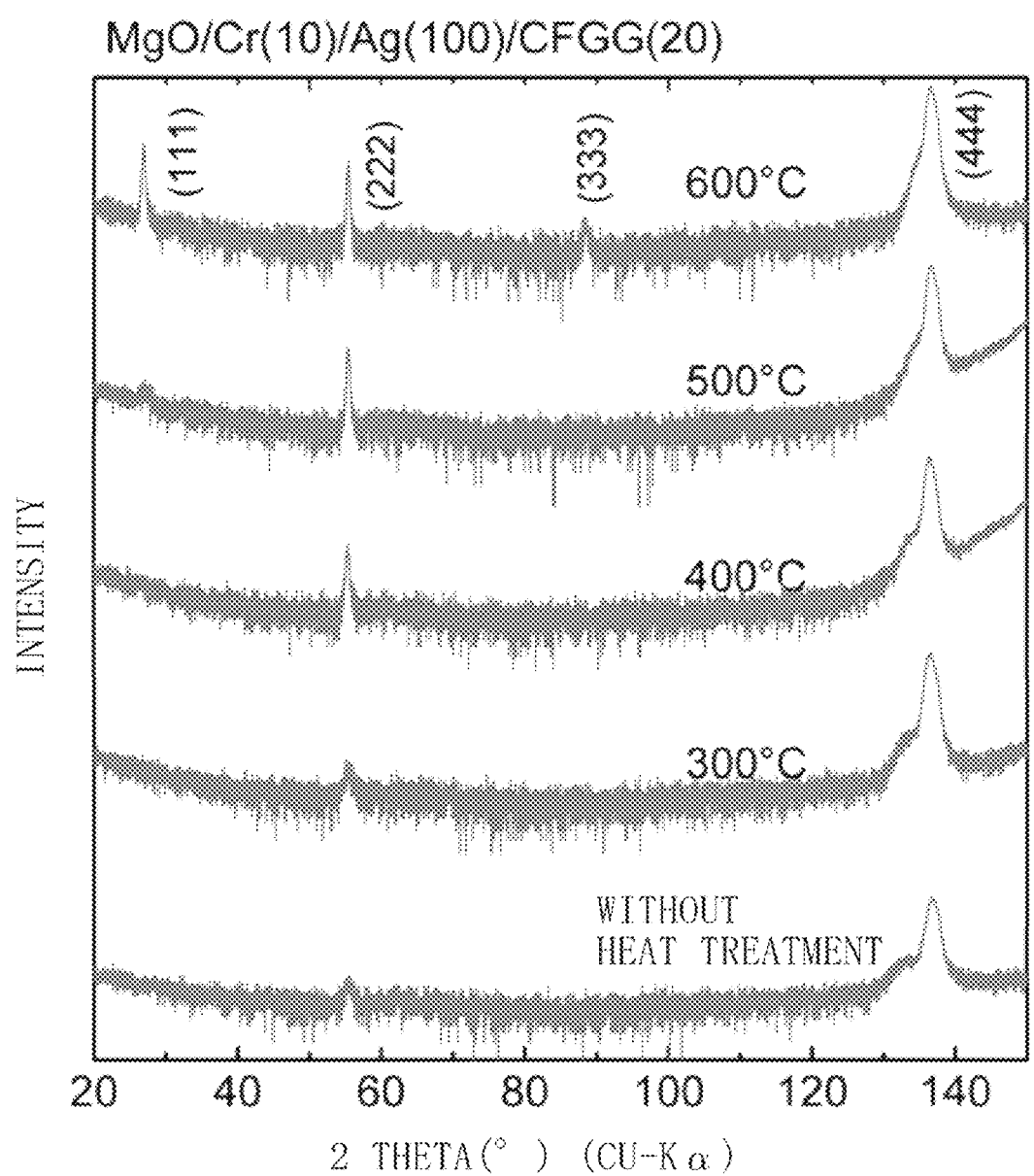
FIG. 8 shows XRD patterns of Co$_{52}$Fe$_{22}$(Ga$_{13}$Ge$_{13}$) thin films annealed at various temperatures.

As the $Co_{52}Fe_{22}Ga_{13}Ge_{13}$ thin film is an epitaxial film, the diffraction peak from other plane can be measured by tilting the film. The results measured by tilting the film were shown in FIG. 8. The diffraction peak from $L2_1$ (111) superlattice was observed at higher than 500° C. Therefore, the film is considered to have a B2 ordered structure up to 400° C. and an $L2_1$ ordered structure at 500° C. or higher. The degrees of $L2_1$ order and B2 order in a 500° C.-annealed sample were estimated to be 0.11 and 0.8, respectively. The lattice parameters of the $Co_{52}Fe_{22}Ga_{13}Ge_{13}$ thin film estimated by Nelson-Riley's function were a=0.576 nm and c=0.570 nm, indicating a cubic crystal.

Figure 9:
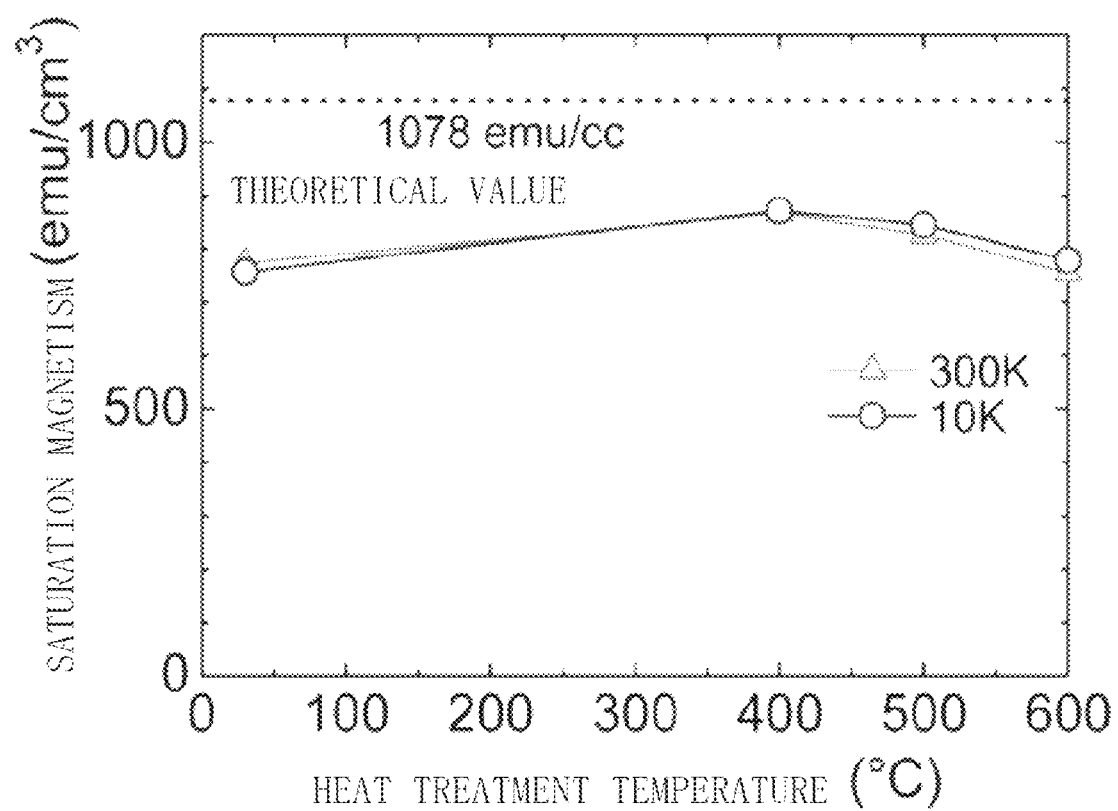
FIG. 9 shows the change of the saturation magnetization of Co$_{52}$Fe$_{22}$(Ga$_{13}$Ge$_{13}$) thin film as a function of annealing temperature.

FIG. 9 shows the annealing temperature dependence of the saturation magnetization of $Co_{52}Fe_{22}Ga_{13}Ge_{13}$ thin film. The circles and triangles show the data at 10 K and RT, respectively. The dotted line in the figure shows a theoretical value. The values are lower than the theoretical one because the film is considered to have an off-stoichiometric composition and imperfection of $L2_1$ order.

Figure 10:
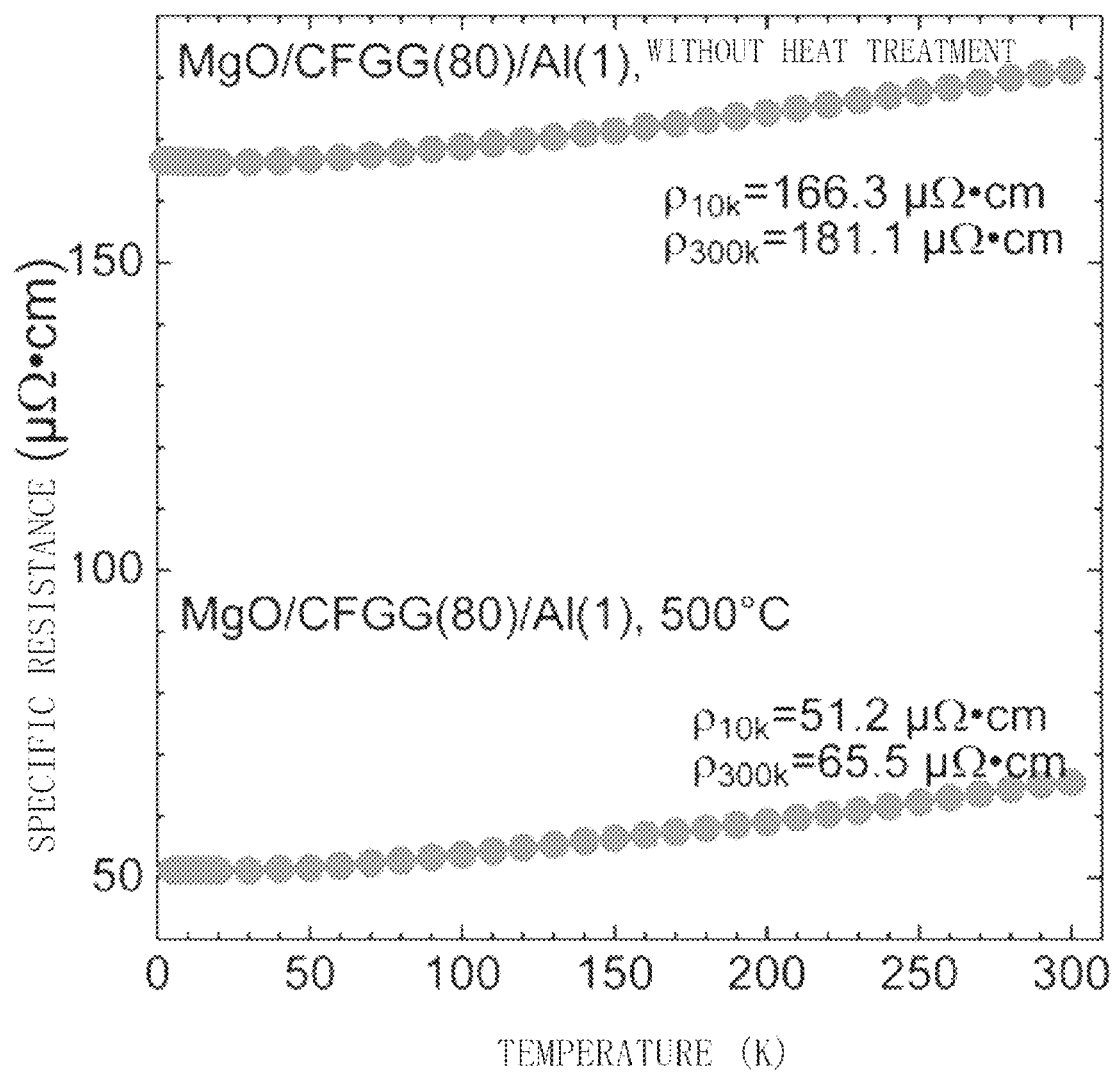
FIG. 10 shows the resistivity changes of Co$_{52}$Fe$_{22}$(Ga$_{13}$Ge$_{13}$) thin films with temperature.

FIG. 10 shows the resistivity changes. The resistivity of the $Co_{52}Fe_{22}Ga_{13}Ge_{13}$ film annealed at 500° C. decreases about one third of unannealed one due to the low spin scattering. It is considered to be attributed to the degree of order.

Figure 11:
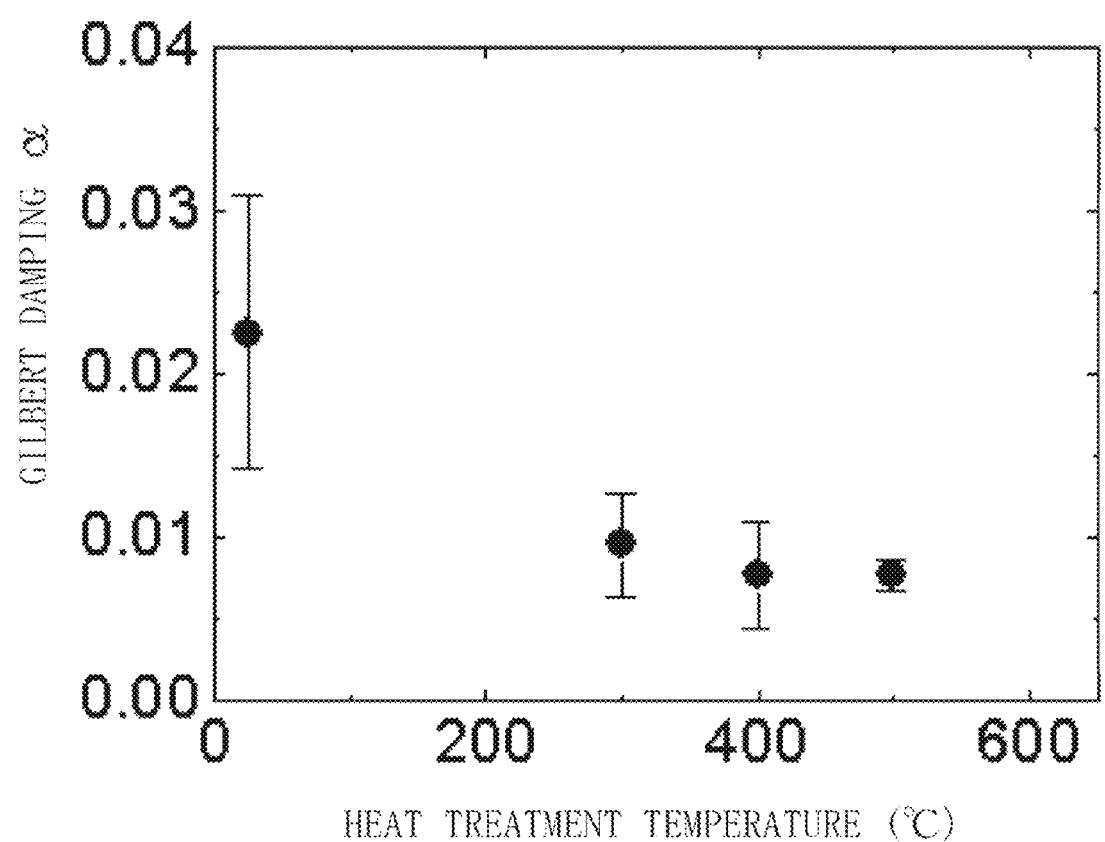
FIG. 11 shows the temperature dependence of the damping constant of Co$_{52}$Fe$_{22}$(Ga$_{13}$Ge$_{13}$) thin films.

Since when the magnetic moment of the $Co_{52}Fe_{22}Ga_{13}Ge_{13}$ thin film is brought into precession by electric current, its response is improved as the damping constant decreases, a lower damping constant is desired in a spin torque oscillator device. FIG. 11 shows the annealing temperature dependence of the damping constant of the $Co_{52}Fe_{22}Ga_{13}Ge_{13}$ thin film. The damping constant decreases with the increase of the annealing temperature, and reaches 0.008 after annealing at 500° C. The value is lower than the damping constant of normal ferromagnetic material like Permalloy whose damping constant is 0.01.

Figure 12:
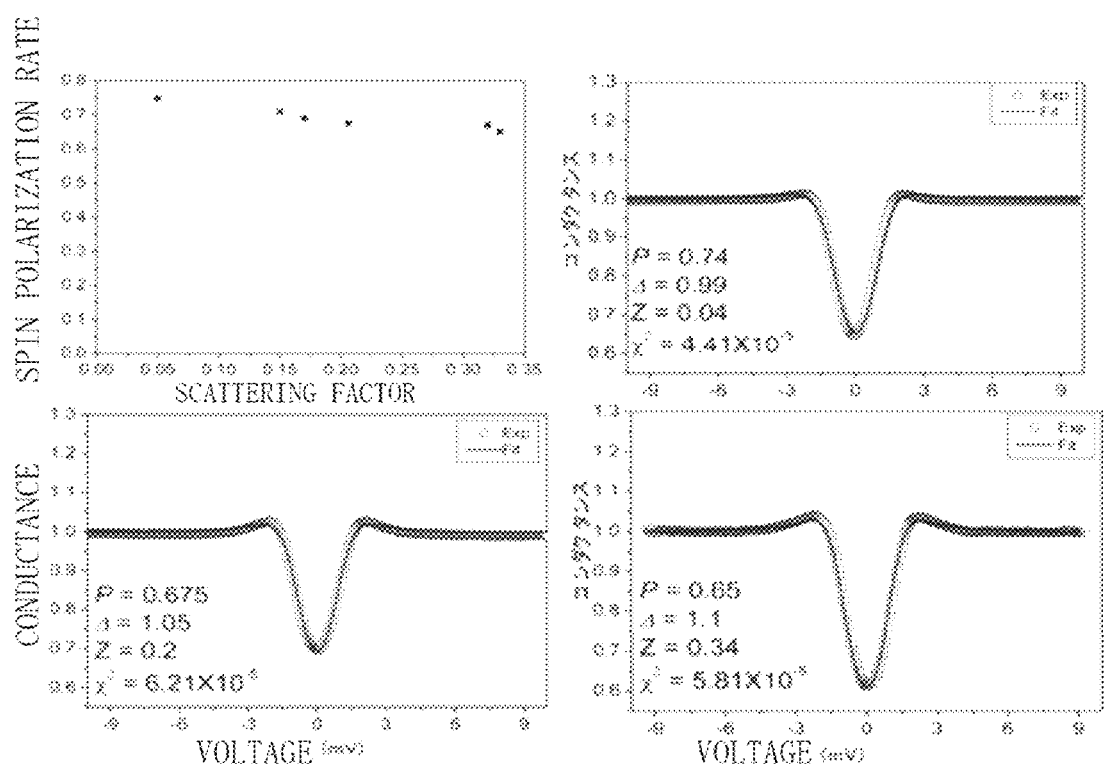
FIG. 12 shows the spin polarization of Co$_{52}$Fe$_{22}$(Ga$_{13}$Ge$_{13}$) thin film after annealing at 500° C.
Figure 13:
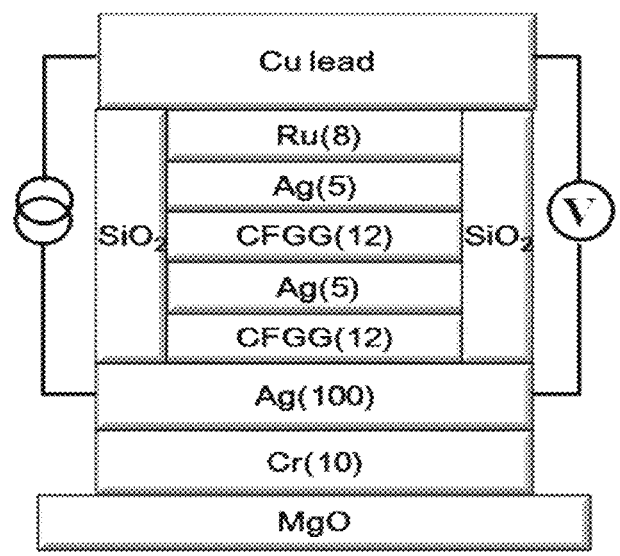
FIG. 13 shows a schematic view of a CPP-GMR device. The film stack from the bottom is MgO substrate/Cr(10)/Ag(100)/Co$_{52}$Fe$_{22}$(Ga$_{13}$Ge$_{13}$) (12)/Ag(5)/Co$_{52}$Fe$_{22}$(Ga$_{13}$Ge$_{13}$) (12)Ag(5)/Ru(8). The numbers in parentheses denote the film thickness in nm.

FIG. 12 shows the spin polarization of the $Co_{52}Fe_{22}Ga_{13}Ge_{13}$ thin film annealed at 500° C. To protect the surface of the $Co_{52}Fe_{22}Ga_{13}Ge_{13}$ thin film against oxidation, 1 nm-thick Al was capped. From the scattering factor dependence of the spin polarization, the spin polarization of the film was estimated to be 0.75 (75%).

<Fabrication of Spintronics Devices>

Based on the experimental results on the $Co_{52}Fe_{22}Ga_{13}Ge_{13}$ thin film, it was confirmed that the $L2_1$ ordered structure and high spin polarization were obtained after annealing at 500° C. Accordingly, CPP-GMR devices using a $Co_{52}Fe_{22}Ga_{13}Ge_{13}$ thin film as a ferromagnetic electrode was fabricated and the transport properties were evaluated.

The film stack was MgO substrate/Cr(10)/Ag(100)/$Co_{52}Fe_{22}Ga_{13}Ge_{13}$(12)/Ag(5)/$Co_{52}Fe_{22}Ga_{13}Ge_{13}$(12)/Ag(5)/Ru(8). The numbers in parentheses indicate the film thickness in nm. The films were fabricated by DC and RF sputtering methods and annealed at 300° C. and 500° C. for 30 min after the deposition of Ag and Ru, respectively. The former annealing was for the improvement of the surface roughness and the latter was for the ordering of the $Co_{52}Fe_{22}Ga_{13}Ge_{13}$ thin film. The CPP-GMR device was processed into an elliptic pillar shape of 70×140 nm², 100×200 nm², 150×300 nm² and 200×400 nm² by EB lithography and Ar ion milling.

Figure 14:
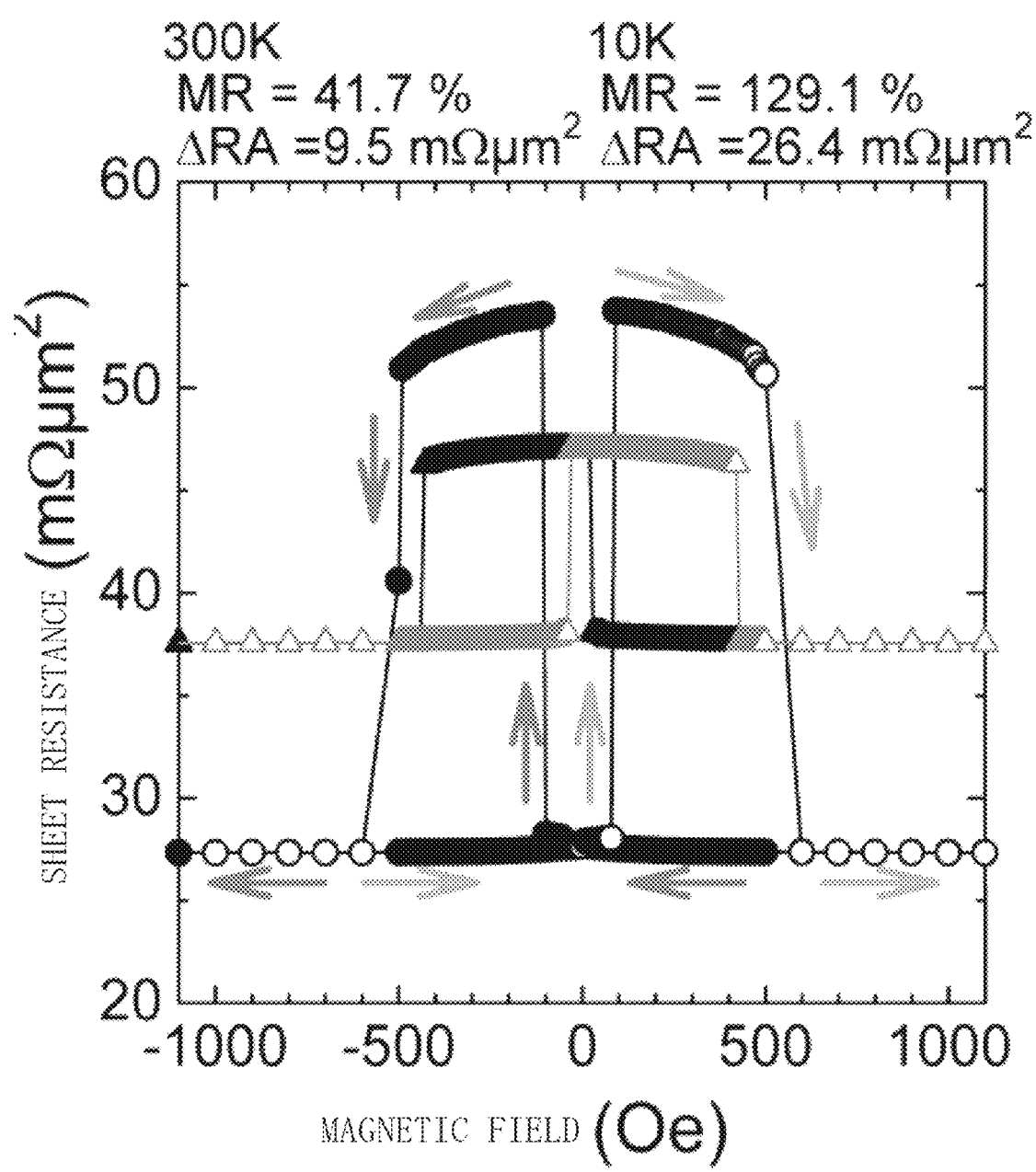
FIG. 14 shows the magnetoresistance change as a function of magnetic field in MgO substrate/Cr(10)/Ag(100)/Co$_{52}$Fe$_{22}$(Ga$_{13}$Ge$_{13}$) (12)/Ag(5)/Co$_{52}$Fe$_{22}$(Ga$_{13}$Ge$_{13}$) (12) Ag(5)/Ru(8). The numbers in parentheses denote the film thickness in nm.

FIG. 14 shows the magnetic field dependence of the magnetoresistance of MgO substrate/Cr(10)/Ag(100)/$Co_{52}Fe_{22}Ga_{13}$ $Ge_{13}$(12)/Ag(5)/$Co_{52}Fe_{22}Ga_{13}Ge_{13}$(12)/ag(5)/Ru(8). The triangle and circle marks correspond to the curves at RT and 10 K, respectively. When the upper and lower $Co_{52}Fe_{22}Ga_{13}Ge_{13}$ electrodes are in an antiparallel configuration, high magnetoresistance showed a high value.

Large values of area-resistance product (ΔRA)=9.5mΩμm$^2$, MR=41.7% at RT, ΔRA=26.4 mΩμm$^2$, MR=129.1% at 10K were obtained. The CPP-GMR of CoFe/Cu/CoFe whose electrodes are of normal ferromagnetic material showed ΔRA=2 mΩμm$^2$, MR=few %. Compared to these values, the CPP-GMR using the $Co_{52}Fe_{22}Ga_{13}Ge_{13}$ electrodes showed a large value.

Figure 15:
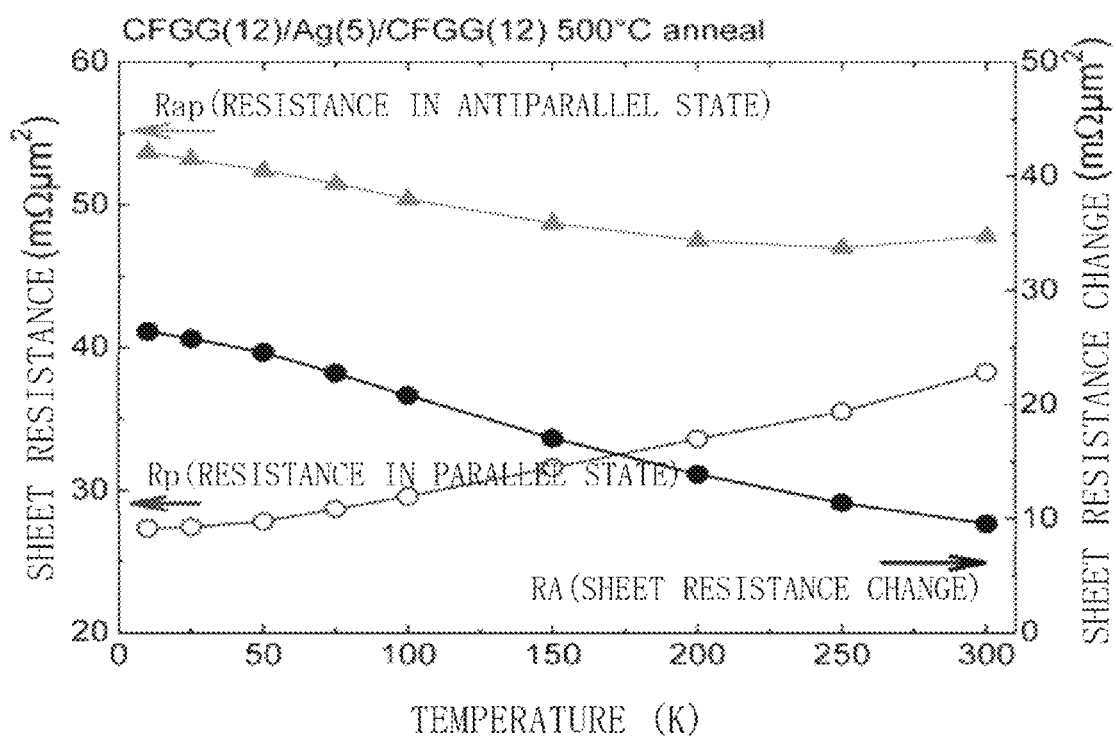
FIG. 15 shows the temperature dependence of ΔRA, R$_p$ (resistance in a parallel configuration of the two ferromagnetic layers) and R$_{ap}$ (resistance in an antiparallel configuration of the two ferromagnetic layers).
Figure 16:
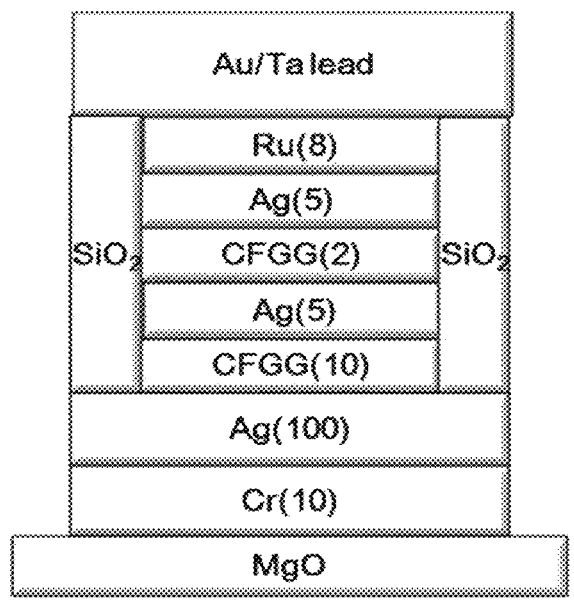
FIG. 16 shows a schematic view of an STO device. The film stack from the bottom is MgO substrate/Cr(10)/Ag(100)/Co$_{52}$Fe$_{22}$(Ga$_{13}$Ge$_{13}$)/Ag(5)/Co$_{52}$Fe$_{22}$(Ga$_{13}$Ge$_{13}$) (2)/Ag(5)/Ru(8). The numbers in parentheses denote the film thickness in nm.

FIG. 15 shows the temperature dependence of the ΔRA, $R_P$(resistance in a parallel configuration) and $R_{AP}$(resistance in an antiparallel configuration). As temperature increases, $R_P$ increases and $R_{AP}$ decreases, resulting in a decrease in ΔRA. The decrease in the ΔRA may be attributed to the decrease in the spin polarization.

Figure 17:
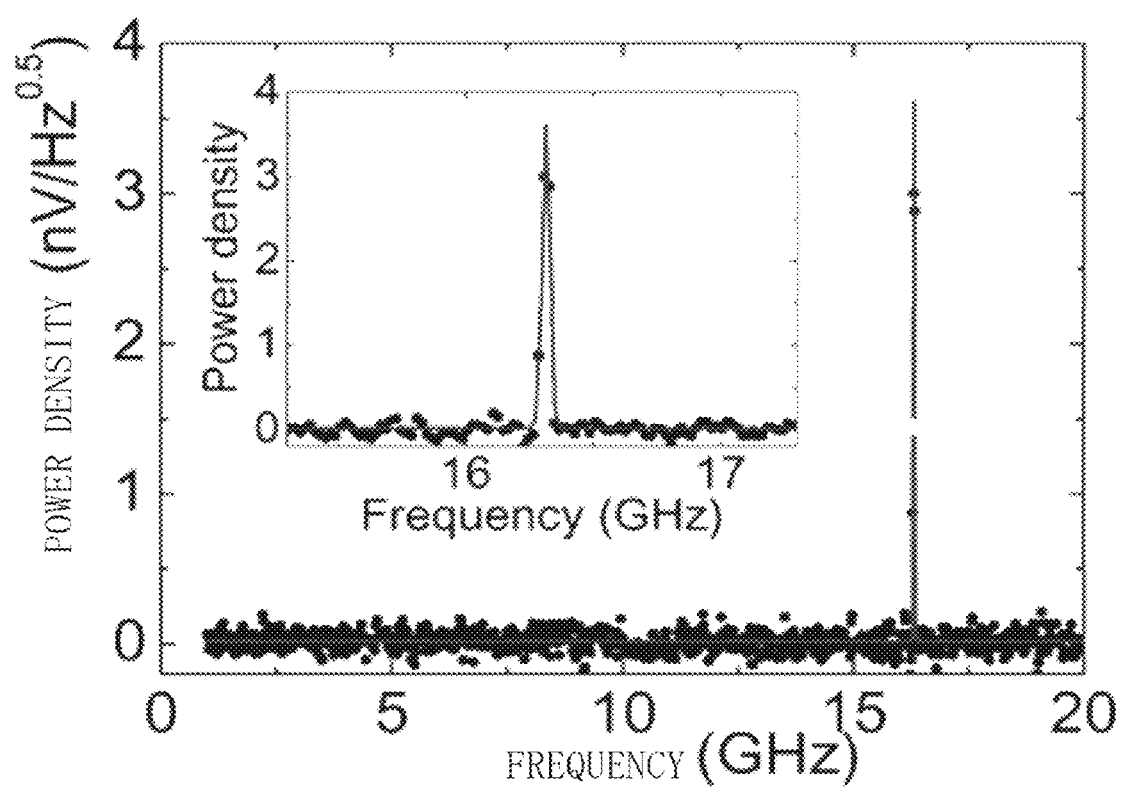
FIG. 17 shows the oscillation characteristics of MgO substrate/Cr(10)/Ag(100)/Co$_{52}$Fe$_{22}$(Ga$_{13}$Ge$_{13}$)/Ag(5)/Co$_{52}$Fe$_{22}$(Ga$_{13}$Ge$_{13}$) (2)/Ag(5)/Ru(8).
Figure 18:
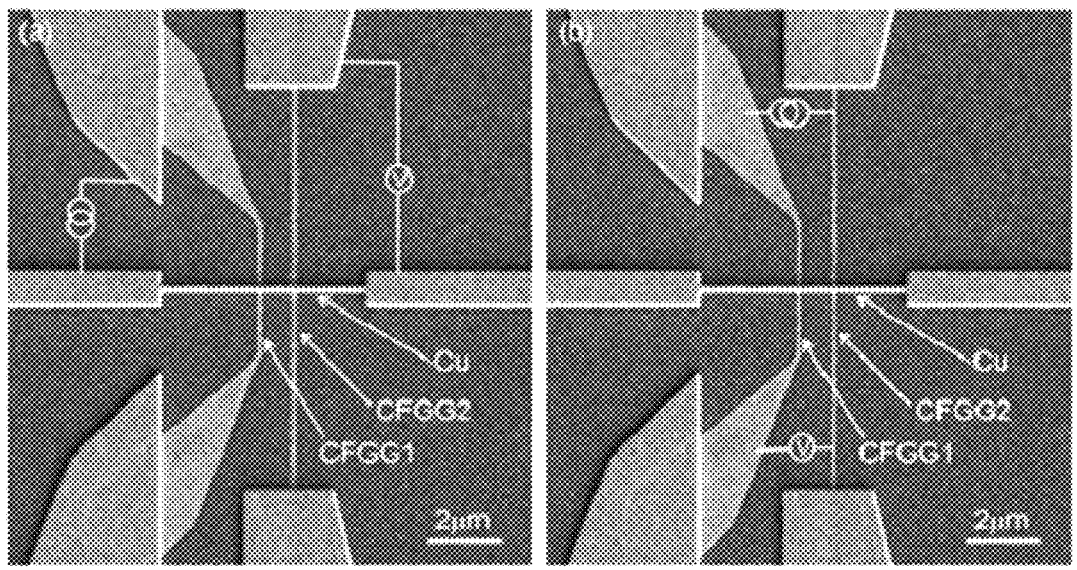
FIG. 18 shows SEM images of an NLSV device: (a) non-local and (b) local configurations.

Moreover, an STO device was fabricated using $Co_{52}Fe_{22}Ga_{13}Ge_{13}$ as a ferromagnetic electrode and measured for the transport properties. The film of MgO substrate/ Cr(10)/Ag(100)/$Co_{52}Fe_{22}Ga_{13}Ge_{13}$(12)/Ag(5)/ $Co_{52}Fe_{22}Ga_{13}Ge_{13}$(12)/Ag(5)/Ru(8) was annealed at 500° C. and formed into a pillar of 130×130 nm$^2$ by microfabrication. An output of 2.5nV/Hz$^{0.5}$ at about 16 GHz was obtained by applying a current of 4.6×10$^7$ A/cm$^2$ and an external magnetic field of 485 Oe (FIG. 17). Note that the line width in this cases was 30 MHz and Q factor was about 460. These values are equivalent to those which have been reported up to now (Non Patent Literature 9).

Figure 19:
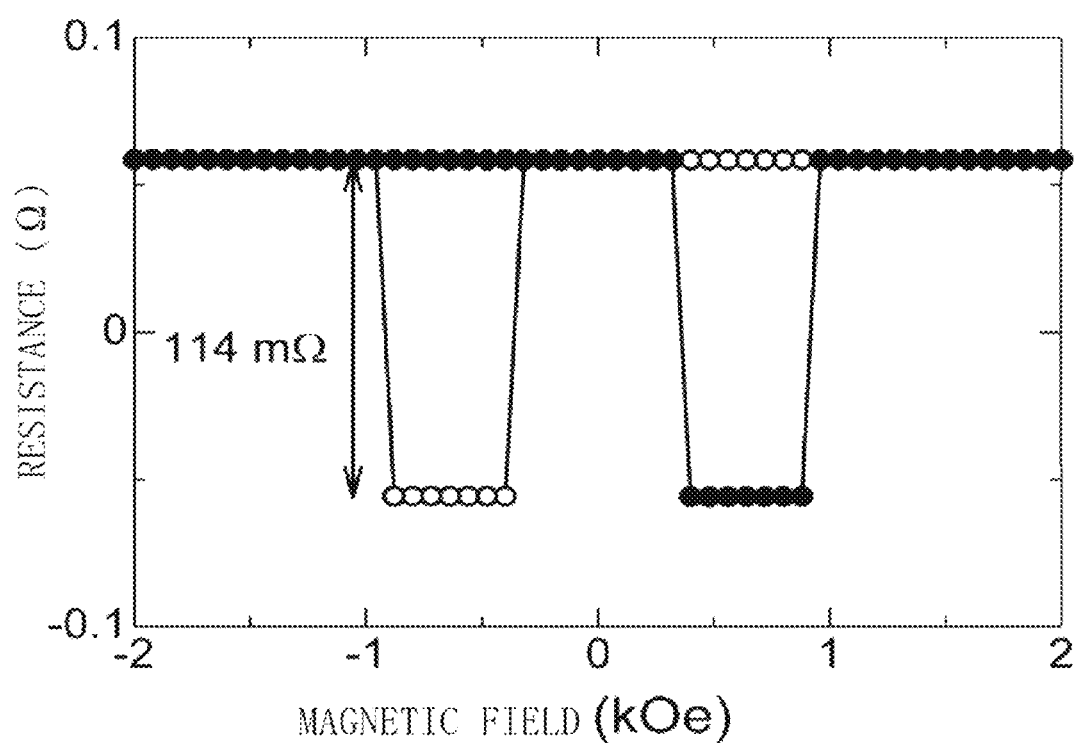
FIG. 19 is the resistance curve of the NLSV device using CFGG in the non-local configuration.
Figure 20:
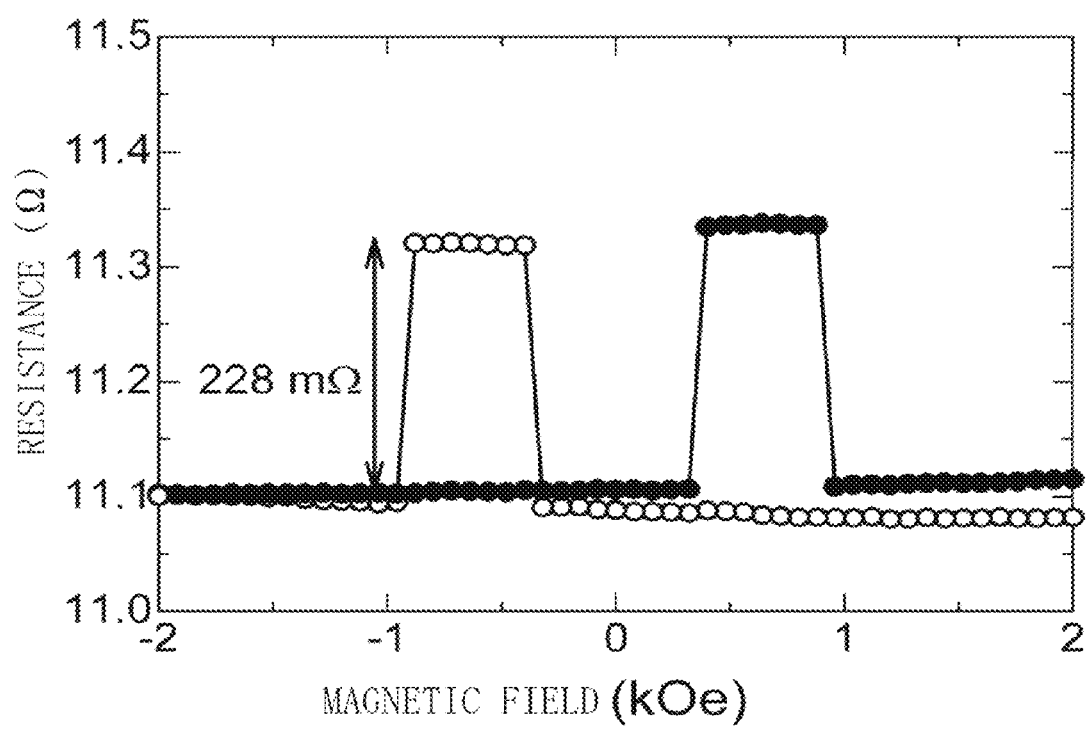
FIG. 20 is the resistance curve of the NLSV device using CFGG in the local configuration.

Further, two ferromagnetic wires (a width of 100 nm) of $Co_{52}Fe_{22}Ga_{13}Ge_{13}$ and a non-magnetic wire (of Ag, a width of 150 nm) that bridges the two ferromagnetic wires were fabricated by the microfabrication to evaluate the transport properties of an NLSV device. As shown in FIG. 19, a very large spin signal of 114 mΩ at the RT was obtained in the nonlocal configuration. This value is larger than any value which has been reported up to now (Non Patent Literatuire 10). The device resistance of the NLSV was small due to the all metal system. Therefore, it is possible to generate a relatively large spin current. The resistance change in a local configuration shown in FIG. 20 is twice as large as that in a nonlocal configuration, which agrees with the analytical calculation results.

As a matter of course, the present invention will not be limited to the above described examples and, as needless to say, various embodiments are possible regarding details thereof.

INDUSTRIAL APPLICABILITY

By using a device according to the high MR ratio material of the present invention it has become possible to provide a read head at a density exceeding 2 Tb/in$^2$, and a microwave-assisted magnetic recording (MAMR) head. Further, it also becomes possible to perform a high efficiency spin injection from the material of the present invention having a high spin polarization to a semiconductor.

The invention claimed is:

1. A $Co_2Fe$-based Heusler alloy element for use in a spintronics device, comprising:
    a thin film of $Co_2Fe$-based Heusler alloy having a thickness 20 nm or less, the thin film being deposited on a substrate having an underlayer,
    wherein the $Co_2Fe$-based Heusler alloy has a composition as shown in Formula 1 below:

$$Co_2Fe(Ga_xGe_{1-x}),\qquad\qquad \text{<Formula 1>}$$

wherein x satisfies 0.25<x<0.60, and
    spin polarization is 0.65 or more.

2. The $Co_2Fe$-based Heusler alloy element of claim 1 wherein the $Co_2Fe$-based Heusler alloy element is used as a ferromagnetic electrode of a CPP-GMR device.

3. The $Co_2Fe$-based Heusler alloy element of claim 1, wherein the $Co_2Fe$-based Heusler alloy element is used as a ferromagnetic electrode of an STO device.

4. The $Co_2Fe$-based Heusler alloy element of claim 1, wherein the $Co_2Fe$-based Heusler alloy element is used as a ferromagnetic electrode, and the Heusler alloy has a B2 order and an L2$_1$ order.

5. A method of making $Co_2Fe$-based Heusler alloy for use in a spintronics device, comprising:
    forming an underlayer on a substrate;
    forming a thin film of $Co_2Fe$-based Heusler alloy at a thickness of 20 nm or less, wherein the $Co_2Fe$-based Heusler alloy has a composition as shown in Formula 1below:

$$Co_2Fe(Ga_xGe_{1-x}),\qquad\qquad \text{<Formula 1>}$$

wherein x satisfies 0.25<x<0.60, and
    heat-treating the thin film in the temperature range 400° C. or more but 600° C. or less.

* * * * *